(12) United States Patent
Shashoua

(10) Patent No.: US 6,535,846 B1
(45) Date of Patent: Mar. 18, 2003

(54) DYNAMIC RANGE COMPRESSOR-LIMITER AND LOW-LEVEL EXPANDER WITH LOOK-AHEAD FOR MAXIMIZING AND STABILIZING VOICE LEVEL IN TELECOMMUNICATION APPLICATIONS

(75) Inventor: Meir Shashoua, Tel Aviv (IL)

(73) Assignee: K.S. Waves Ltd., Tel Aviv (IL)

( * ) Notice: Subject to any disclaimer, the term of this patent is extended or adjusted under 35 U.S.C. 154(b) by 189 days.

(21) Appl. No.: 09/634,885

(22) Filed: Aug. 7, 2000

Related U.S. Application Data
(60) Provisional application No. 60/158,034, filed on Oct. 7, 1999.

(30) Foreign Application Priority Data

Mar. 19, 1997 (EP) .......................................... 0 763 888 A
Jan. 17, 1998 (GB) .......................................... 2 000 945 A
Jul. 21, 1998 (US) .......................................... 5 784 476 A

(51) Int. Cl.[7] .............................................. G10L 11/00
(52) U.S. Cl. ...................... 704/225; 704/224; 704/206; 379/347
(58) Field of Search ................................. 704/224, 225, 704/206, 500; 379/347; 381/17

(56) References Cited

U.S. PATENT DOCUMENTS

| 4,870,370 A | * | 9/1989 | Hedberg et al. ............ 330/133 |
| 5,832,444 A | | 11/1998 | Schmidt |
| 5,838,194 A | | 11/1998 | Khoury |
| 5,854,845 A | | 12/1998 | Itani |
| 6,104,992 A | * | 8/2000 | Gao et al. ................... 704/220 |
| 6,175,631 B1 | * | 1/2001 | Davis et al. .................. 381/17 |
| 6,185,300 B1 | * | 2/2001 | Romesberg ................. 379/410 |

* cited by examiner

Primary Examiner—Susan McFadden
(74) Attorney, Agent, or Firm—Browdy and Neimark, P.L.L.C.

(57) ABSTRACT

A voice signal processing system with multiple parallel control paths, each of which address different problems, such as the high peak-to-RMS signal ratios characteristic of speech, wide variations in RMS speech levels, and high background noise levels. Different families of input-output control curves are used simultaneously to achieve efficient peak limiting and dynamic range compression as well as low-level dynamic expansion to prevent excessive amplification of background noise. In addition, a delay in the audio path relative to the control path makes it possible to employ an effective look-ahead in the control path, with FIR filtering smoothing-matched to the look-ahead. Digital domain peak interpolators are used for estimating the peaks of the input signal in the continuous time domain.

8 Claims, 9 Drawing Sheets

DYNAMIC RANGE COMPRESSOR-LIMITER AND LOW-LEVEL EXPANDER WITH LOOK-AHEAD FOR MAXIMIZING AND STABILIZING VOICE LEVEL IN TELECOMMUNICATION APPLICATIONS

This application claims the benefit of Ser. No. 60/158,034, filed Oct. 7, 1999.

FIELD OF THE INVENTION

The present invention relates to voice processing and, more particularly, to voice processing for telecommunication and other narrow dynamic range voice communication systems, where it is desired to maximize and stabilize the level of received or transmitted speech.

BACKGROUND OF THE INVENTION

Speech signals are characterized by a large dynamic range and a high peak-to-RMS ratio. In telephony applications, especially cellular telephony, this dynamic range is further exaggerated due to variations in relative positioning of the talker and microphone, variations of voice level between different talkers, variations in same talker's voice level, and similar variable factors.

On the other hand, the reproduction circuitry of common telephones are limited in their dynamic range, especially for cellular phones where supply voltage, physical size, and cost are a further limiting factor. An extreme example is the cellular/mobile speakerphone, where despite severe restrictions on the dynamic range, satisfactory listening requires a minimum loudness level from the speakerphone.

There are three major problems associated with dynamic range in telephony applications:

- the high peak-to-RMS ratio naturally characteristic of speech signals;
- the wide variations in RMS level of speech signals; and
- the high level of background noise typically encountered in telephony applications.

Treating the speech signal by applying signal processing techniques can significantly improve the situation, but as will be explained, each of the above problems requires a different treatment in order to achieve optimal results.

Various methods and circuits are known in the prior art for automatic gain control (AGC), such as disclosed in U.S. Pat. No. 5,854,845 to Itani, U.S. Pat. No. 5,832,444 to Schmidt, and U.S. Pat. No. 5,838,194 to Khoury.

None of the prior art methods, however, fully address all of the above-mentioned problems, but provide for only limited improvements. While such limited improvements may have been sufficient for traditional telephony, they are not adequate to deal with the more severe problems posed by cellular/mobile telephony.

The automatic gain control methods described in the prior art incorporate an input-output target response that allows no dynamic variation in the signal range (the target output level is constant except when noise is detected). This is a highly unnatural output target response, which forces using a slow response time in order to permit some reasonable dynamics of the processed speech signal. Another factor that slows down the response is the need to decrease the amount of audible distortion introduced into the signal.

On the other hand, controlling signal peaks demands a short response time, and therefore controlling signal peaks is not possible when a slow response time is used. For this reason, prior art methods fail to reduce the high peak-to-RMS ratio of speech, and sometimes even increase it, as can be seen for example in Khoury (U.S. Pat. No. 5,838,194), FIGS. 13 and 14.

Another limitation of prior art methods is that they deal with both the AGC of the speech signal, as well as with the muting or reduction of background noise traveling through the same signal path. This forces a single method of detecting the envelope; the response times involved, and the smoothing applied, to deal with significantly different problems. Because of this, the performance of such methods is degraded.

There is thus a widely recognized need for, and it would be highly advantageous to have, a means of that can simultaneously of automatically maximizing and stabilizing speech signals that can handle a high peak-to-RMS ratio, wide variations in RMS level, and high levels of background noise. This goal is met by the present invention.

SUMMARY OF THE INVENTION

It is an object of the present invention to provide a method for processing speech signals that provides an optimal solution for all the previously-mentioned problems, and allows for maximizing and stabilizing the RMS voice level, significantly reducing the peak-to-RMS ratio, and avoiding excessive amplification of background noise.

The present invention discloses several novel concepts that significantly alleviate the above mentioned problems. These novel concepts are:

1. Implementing more than one control path in a parallel fashion, where each path addresses a different problem. This permits a separate optimizing of the envelope estimation method and response time, control curves, and the control signal smoothing method and response time.
2. Utilizing a family of input-output control curves suitable for both peak limiting and dynamic range compression (herein denoted as compressor-limiter control curves).
3. Utilizing a family of input-output control curves suitable for preventing excessive amplification of background noise. (herein denoted as low-level expander control curves).
4. Delaying the audio path to allow for look-ahead in the control path.
5. Utilizing finite impulse response (FIR) filtering smoothing matched to the look-ahead.
6. Utilizing digital domain peak-interpolators for estimating the peaks of the corresponding input signal in the continuous time domain.

FIG. 1 shows a generic block diagram according to the invention and illustrates the use of multiple parallel control paths. Signal paths 22 and 24 carry at least one signal and implement the parallel control path principle of the present invention. An input signal 10 is fed in parallel into a delay line 18 and an envelope extractor 12. Envelope extractor 12 extracts at least one envelope of input signal 10. More than one envelope will be extracted for a multiple parallel control path. The envelopes are fed via signal path 22 to a control gain calculator 14. Control gain calculator 14 calculates a gain for each envelope, and the gains are fed via signal path 24 to a control smoother 16, which smoothes the gains and delivers a single consolidated output control gain, which is in turn applied to the output of the delay line at an output multiplier 20 to produce the final output.

According to the present invention there is provided a voice signal processing system receiving an input signal characterized by at least one envelope, the system having an output signal and a specified maximum gain, the system including: (a) an input for receiving the input signal; (b) an envelope extractor coupled to the input for extracting at least one envelope of the input signal; (c) a control gain calculator coupled to the envelope extractor, for calculating at least one gain, wherein the control gain calculator is operative to performing a calculation of the group containing: (i) a first gain calculation of $$\frac{1}{\frac{1}{Gain}+\left(1-\frac{1}{Gain}\right)*Env},$$

wherein Env is an envelope and Gain is the specified maximum gain; (ii) a second gain calculation of the minimum of 1.0 and Env/Th, wherein Th is a threshold below which the result of the second gain calculation decreases; and (iii) the product of the first gain calculation and the second gain calculation; (d) a control smoother coupled to the control gain calculator for smoothing the at least one gain, and for delivering as the output signal a control gain; (e) a delay line coupled to the input, to produce a delayed input; and (f) an output multiplier coupled to the delay line and to the control smoother for applying the control gain to the delayed input.

BRIEF DESCRIPTION OF THE DRAWINGS

The invention is herein described, by way of example only, with reference to the accompanying drawings, wherein.

DESCRIPTION OF THE PREFERRED EMBODIMENTS

As previously noted, the three major problems associated with dynamic range in telephony applications are the high peak-to-RMS ratio natural to speech signals, the wide variations in RMS level of speech signals, and the high level of background noise typical to telephony applications.

The principles and operation of a compressor-limiter/low-level expander according to the present invention may be understood with reference to the drawings and the accompanying description.

Figure 1:
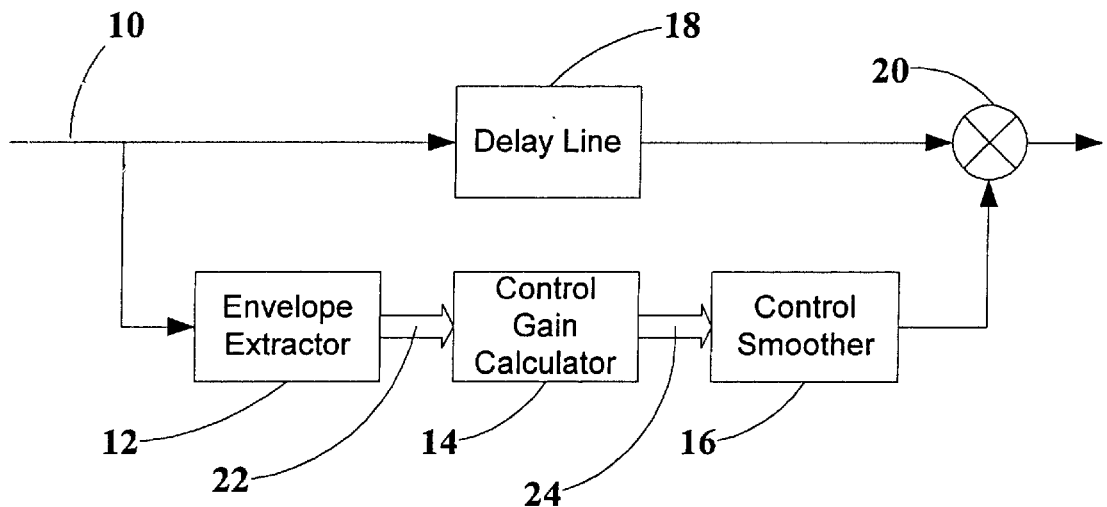
FIG. 1 shows a generic block diagram according to the present invention.
Figure 2:
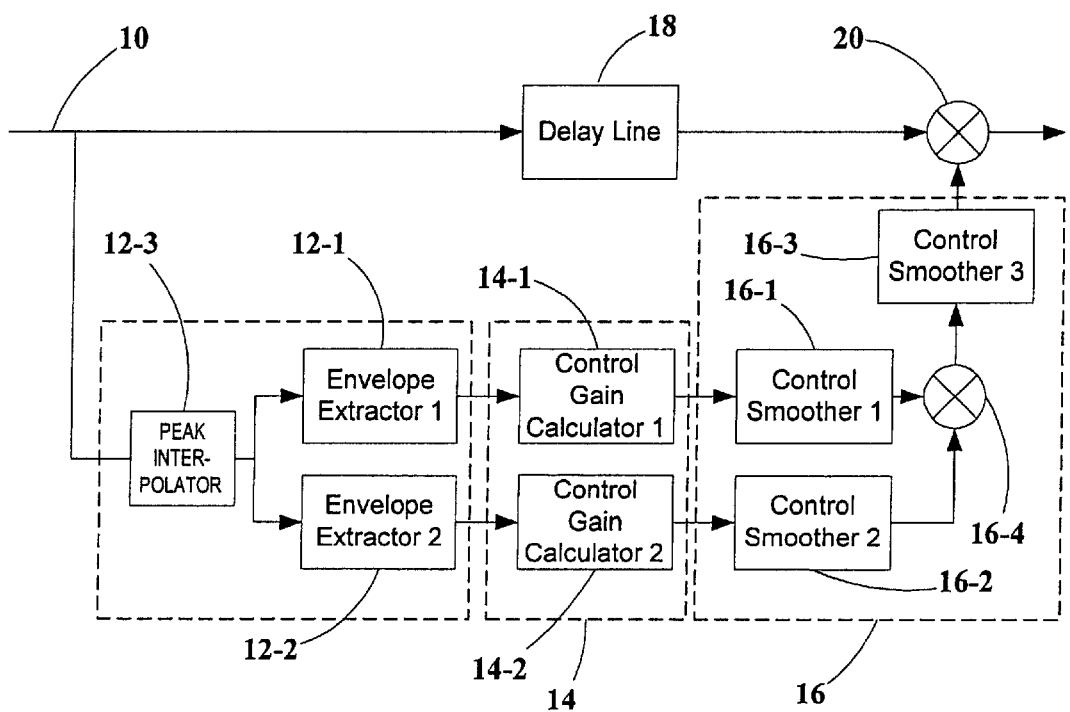
FIG. 2 shows an embodiment of the invention using two parallel control paths.

FIG. 2 shows an embodiment of the invention where two parallel control paths are used. The general blocks including envelope extractor 12, control gain calculator 14, control smoother 16, and delay line 18 retain the same functionality as previously illustrated in FIG. 1. The detailed internal structure of each block supports two parallel paths. The first path consists of a first envelope extractor 12-1, a first control gain calculator 14-1, and a first control smoother 16-1 and is designed to deliver limiting and dynamic range compression control gain. The second path consists of a second envelope extractor 12-2, a second control gain calculator 14-2, and a second control smoother 16-2, and is designed to deliver low-level-expansion control gain. It is noted that a peak interpolator 12-3, inside envelope extractor block 12, feeds both the first envelope extractor 12-1 and the second envelope extractor 12-2. Sharing of the same peak interpolator for the two paths is done for computational efficiency. It is also noted that a FIR filter smoothing 16-3 is used inside control smoother 16, by applying the gains from control smoother 16-1 and control smoother 16-2 combined by a multiplier 16-4.

As a non-limiting example, first envelope extractor 12-1 can be a recursive peak-envelope extractor, as described in the following algorithmic expression:

if $Env(i-1) > abs(In(i))$     (1)

$Env(i) = tc*Env(i-1)+(1-tc)*abs(In(i))$ else $Env(i) = abs(In(i))$ where:

In (i) is the input to the envelope extractor at sample interval i;

Env (i) is the extracted envelope's value at sample interval i; and tc is a constant controlling the release time of the envelope extractor. In this case, a release time of about 10 milliseconds is appropriate.

As a non-limiting example, second envelope extractor 12-2 can be a recursive RMS-envelope extractor, such as described in the following algorithmic expression:

$Env(i) = tc*Env(i-1)+(1-tc)*abs(In(i))$     (2)

where:

In (i) is the input to the envelope extractor at sample interval i;

Env (i) is the extracted envelope's value at sample interval i; and tc is a constant controlling the release time of the envelope extractor. In this case, a release time of about 100 milliseconds is appropriate.

Thus, the different task of limiting and compressing the dynamic range, and the task of low-level-expansion are each provided with suitable methods of envelope extraction, each involving suitable response times.

Figure 3:
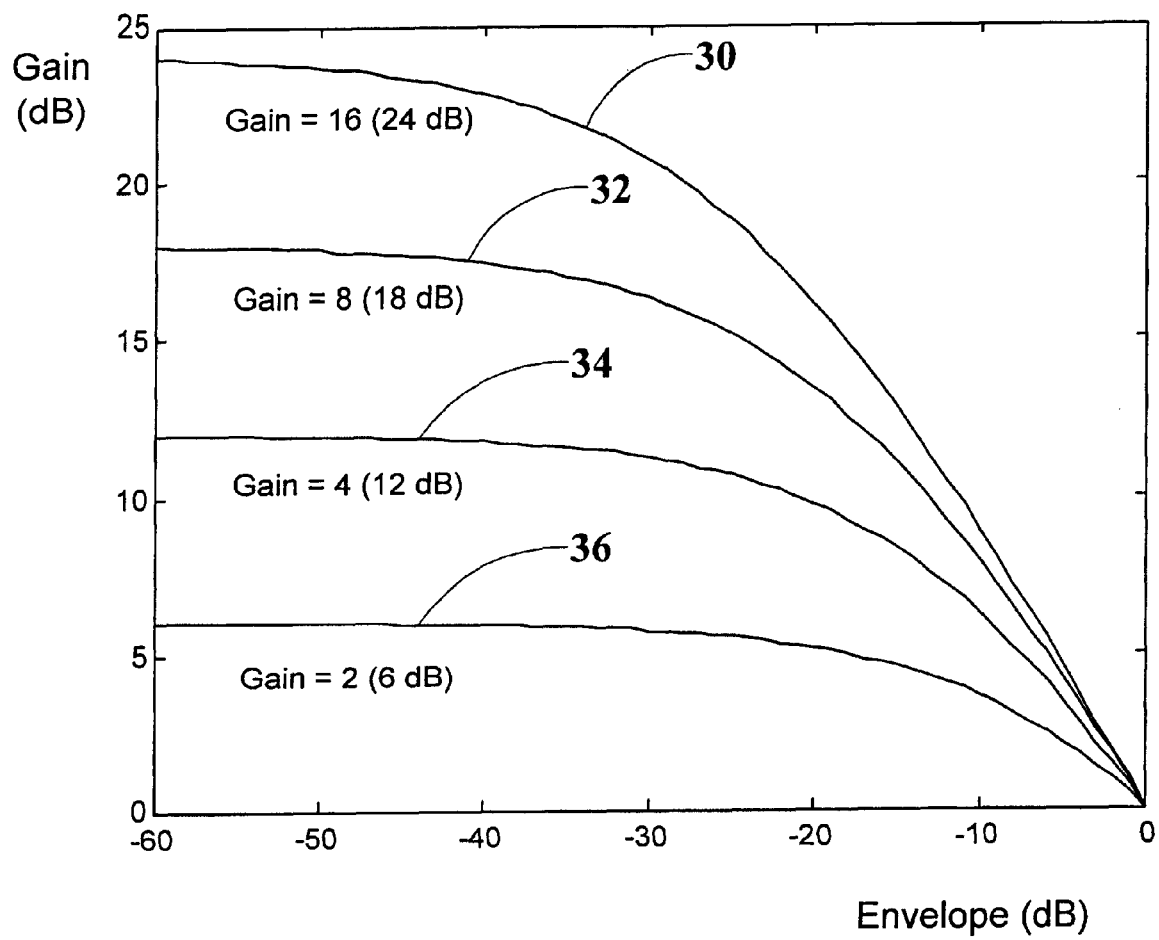
FIG. 3 is a graph of the compressor-limiter control gain versus envelope according to the present invention.

FIG. 3 illustrates the use of a family of compressor-limiter control curves, and is a graph of compressor-limiter control gain versus envelope according to the present invention. These graphs are suggested for the control gain calculator for the case of limiting and dynamic range compression, and are described by the following algorithmic expression:

$$g_1 = \frac{1}{\frac{1}{Gain} + \left(1 - \frac{1}{Gain}\right) * Env} \quad (3)$$

where:
$g_1$ is the functional gain;
Env is an envelope input to the control gain calculator; and
Gain is a desired maximum gain.

Four curves are shown, corresponding to desired maximum Gain levels: a curve 30 for 24 dB, a curve 32 for 18 dB, a curve 34 for 12 dB, and a curve 36 for 6 dB. As can be noted from the graphs, the general behavior of all these curves can be characterized as follows:

For envelope values lower than 1/Gain the curve asymptotically approaches the desired maximum gain Gain. In this range a gentle dynamic range compression of about 6 dB takes place.

For envelope values in the range of about 1/Gain to √(1/Gain), the curve gradually lowers the gain. In this range most of the dynamic range compression takes place.

For envelope values of about √(1/Gain) to 1.0, the curve asymptotically approaches 1/Env. In this range limiting takes place.

Due to their gradually changing character, these curves are suitable to perform both the limiting and dynamic range compression task, and even under very fast response time, will still allow for reasonable dynamics of the processed speech signal.

Figure 4:
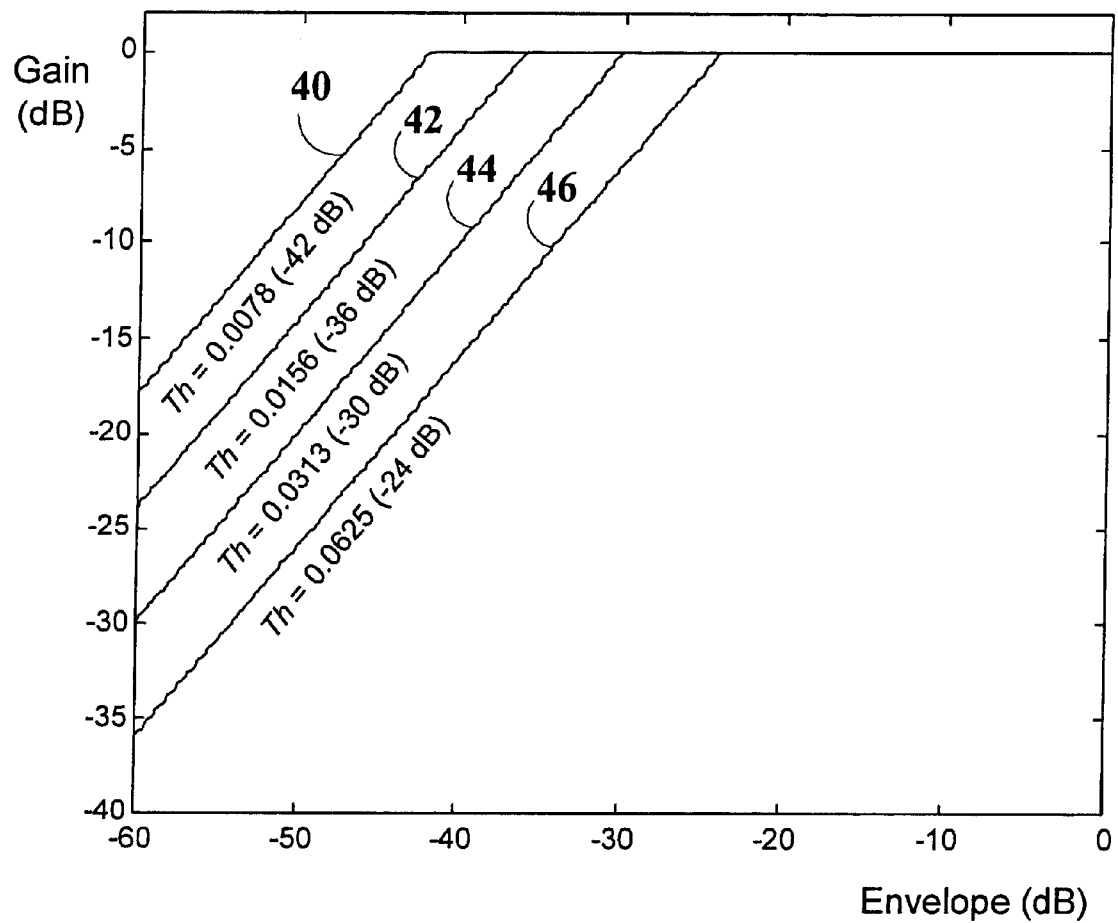
FIG. 4 is a graph of the low-level expander control gain versus envelope according to the present invention.

FIG. 4 illustrates the use of a family of low-level expander control curves, and is a graph of low-level expander control gain versus envelope according to the present invention. These graphs are suggested for the control gain calculator in order to prevent excessive amplification of background noise, and are described by the following algorithmic expression:

$$g_2 = \text{minimum } (1.0, Env/Th) \quad (4)$$

where
Env is an envelope input to the control gain calculator; and
Th is a desired threshold below which gain should decrease.

Four curves are shown, corresponding to desired Threshold levels: a curve 40 for −42 dB, a curve 42 for −36 dB, a curve 44 for −30 dB, and a curve 46 for −24 dB. As can be noted from the graphs, the general behavior of all these curves can be characterized as follows:

For envelope values above the Threshold, the gain is constant 1.0 (0 dB). This range is where the speech signal is expected.

As envelope values drop below the Threshold, the gain begins to decrease at the same rate as does the envelope.

Due to the gradual decrease of gain below the Threshold, these curves cope well in situations where the actual speech signal happens to fall below the Threshold.

Figure 5:
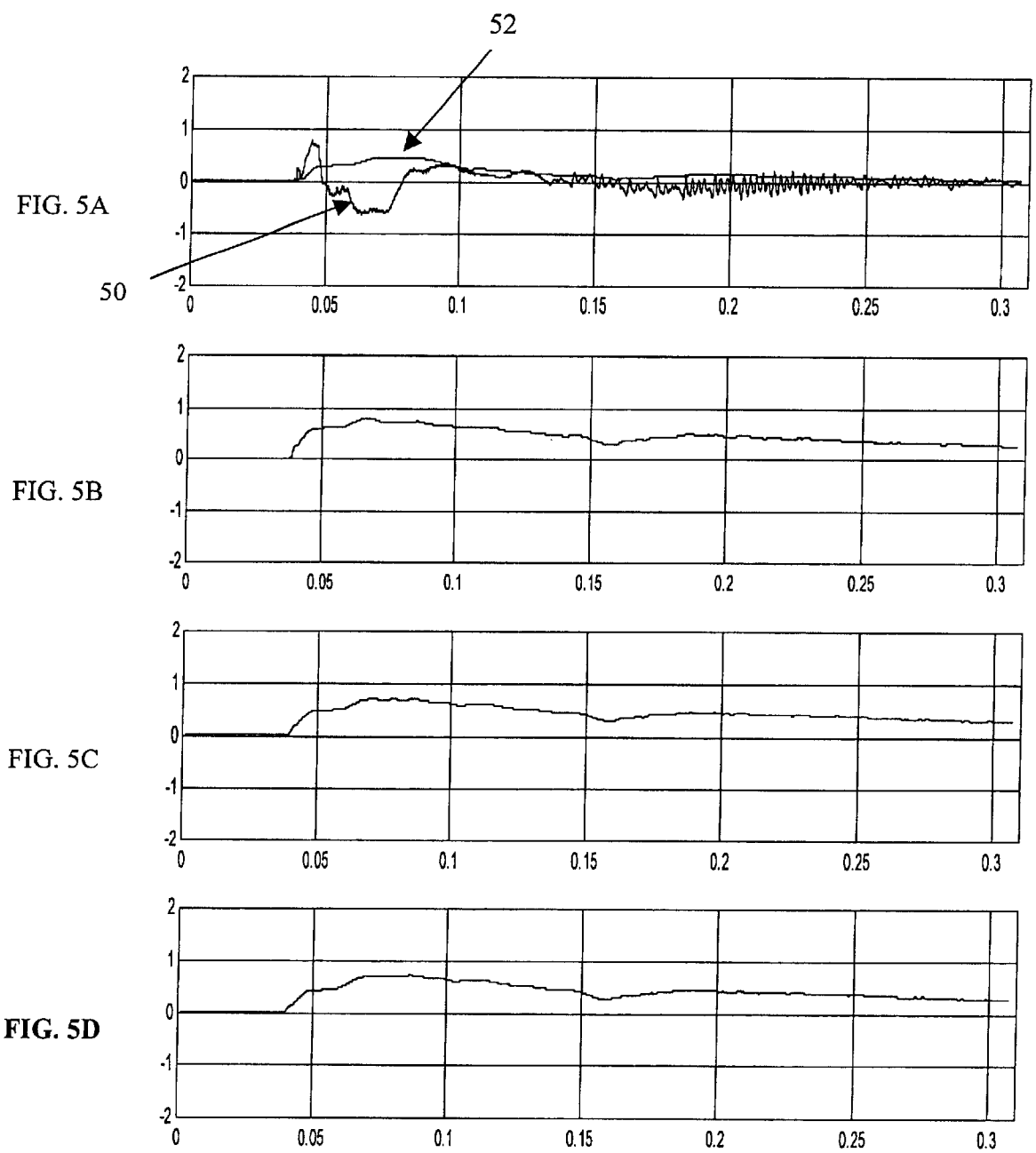
FIG. 5 shows the effect of look-ahead, and look-ahead in combination with recursive or FIR filter smoothing, according to the present invention.

FIGS. 5A through 5C illustrate the use of a delay in the audio path to allow for a look-ahead in the control path. FIG. 5D illustrates the use of FIR filtering, and shows the effect of look-ahead, and look-ahead in combination with recursive or FIR filter smoothing, according to the present invention. The ability to precisely control peaks and Peak-to-RMS ratio is shown.

Precise control of the peaks of a speech signal requires instant response. This requirement forces smoothing with short response time, and conflicts with the need to reduce audible distortions, which requires longer response times.

In order to be able to apply smoothing with longer response time, while still being able to precisely control the peaks, the concept of look-ahead is introduced. According to the present invention, the input signal path is delayed relative to the control signal path. This is equivalent to allowing the control logic to look ahead in time, and to make adjustments for future changes in the input signal, prior to when the input arrives at the final output. Thus, introducing a delay into the input allows the use of control smoothing with slower response time while still achieving precise control of the peaks.

According to the invention, any kind of smoothing can be applied in order to take advantage of the look-ahead, such as infinite input response (IIR) recursive smoothing or linear phase FIR smoothing. While recursive smoothing is more efficient to implement, linear phase FIR smoothing can achieve more precise results. According to the present invention, therefore, in order to achieve the best results, a linear phase FIR filter of order N should be used, where N exactly equals the number of delay samples in the look-ahead delay line. Also, the sum of all the FIR filter coefficients should equal 1.0. A practical example of such a filter is a simple running average of order N, as described below:

$$y(i)=(1/N)*(x(i)+x(I-1)+ \ldots +x(i-N+1)) \quad (5)$$

where:
x(i) is the input to the filter at time i,
y(i) is the output of the filter at time i.
N is the FIR filter order.

Equation (5) may also be written in the form:

$$y(i)=a_1*x(i-N+1)+a_2*x(i-N+2)+ \ldots +a_k*x(i-N+k)+ \ldots +a_N*x(i) \quad (6)$$

where the filter coefficients a obey the following condition:

$$a_1+a_2+ \ldots +a_k+ \ldots +a_N=1 \quad (7)$$

An example for IIR recursive smoothing filter is:

$$y(i)=tc*y(I-1)+(1-tc)*x(i) \quad (8)$$

where:
x(i) is the input to the filter at time i,
y(i) is the output of the filter at time i.
tc is a time constant controlling the response time of the filter. In this case the response time should match the delay time introduced by the look-ahead delay line.

FIG. 5A shows the unprocessed speech signal of the syllable 'plo' from the word 'plosives'. Featured are a speech signal 50 with an RMS 52. It can be seen that the peak-to-RMS ratio in this case is more than 12 dB.

FIG. 5B shows the same speech signal of FIG. 5A processed with no look-ahead by the following processing chain: The recursive peak-envelope extractor of Equation (1), with a response time of 10 milliseconds, followed by the control gain calculator of Equation (3) above, using a Gain of 20 dB, followed by the recursive smoothing filter of Equation (8) above, using a time constant of 1 millisecond.

FIG. 5C shows the same speech signal of FIG. 5A processed by the processing chain as in FIG. 5B but with a look-ahead of 1 millisecond.

FIG. 5D shows the same speech signal of FIG. 5A processed by the processing chain as in FIG. 5B but with a look-ahead of 1 millisecond, and using the FIR filter of Equation (5) above instead of the recursive smoothing filter of Equation (8).

It can be readily seen that in the case illustrated by FIG. 5B, where no look-ahead was employed, the peaks at the beginning of the syllable (at around t=0.03 ms) increased significantly, and the overall peak to RMS actually increased. Also the resulting signal exceeds the value ±1.0, reaching almost ±2.0, which will cause clipping. These problems arise since the smoothing with 1 millisecond response time does not allow the control gain to follow changes of the input signal fast enough.

In the case illustrated by FIG. 5C, where the same smoothing filter is used, but with look-ahead, it can be seen that the peaks at the beginning are properly controlled and the overall peak-to-RMS is reduced. The resulting signal exceeds ±1.0 only by a small, tolerable amount.

In the case illustrated by FIG. 5D, where the FIR filter is used, the best control over the peaks and the best peak-to-RMS are attained. The resulting signal does not exceed ±1.0.

It should be noted that the above smoothers could be cascaded with other types of smoothers that have instant attack time, without degrading the performance regarding peaks. In particular, since a slow release time after a peak is typically preferred, cascading a smoother having instant attack time and slow release time is desirable, because doing so will maintain the attack functionality while increasing the release time.

One example for such an instant attack, slow release smoother is described by the following algorithmic expression:

if $(x(i)>y(i))$                                                 (9)

$y(i)=y(i-1)*tc+x(i)*(1-tc)$ else $y(i)=x(i)$ where:

x(i) is the input control gain to the smoother at time i.

y(i) is the resulting smoothed control gain at time i.

tc is a time constant in the range 0<tc<1 that controls the release time.

Figure 6:
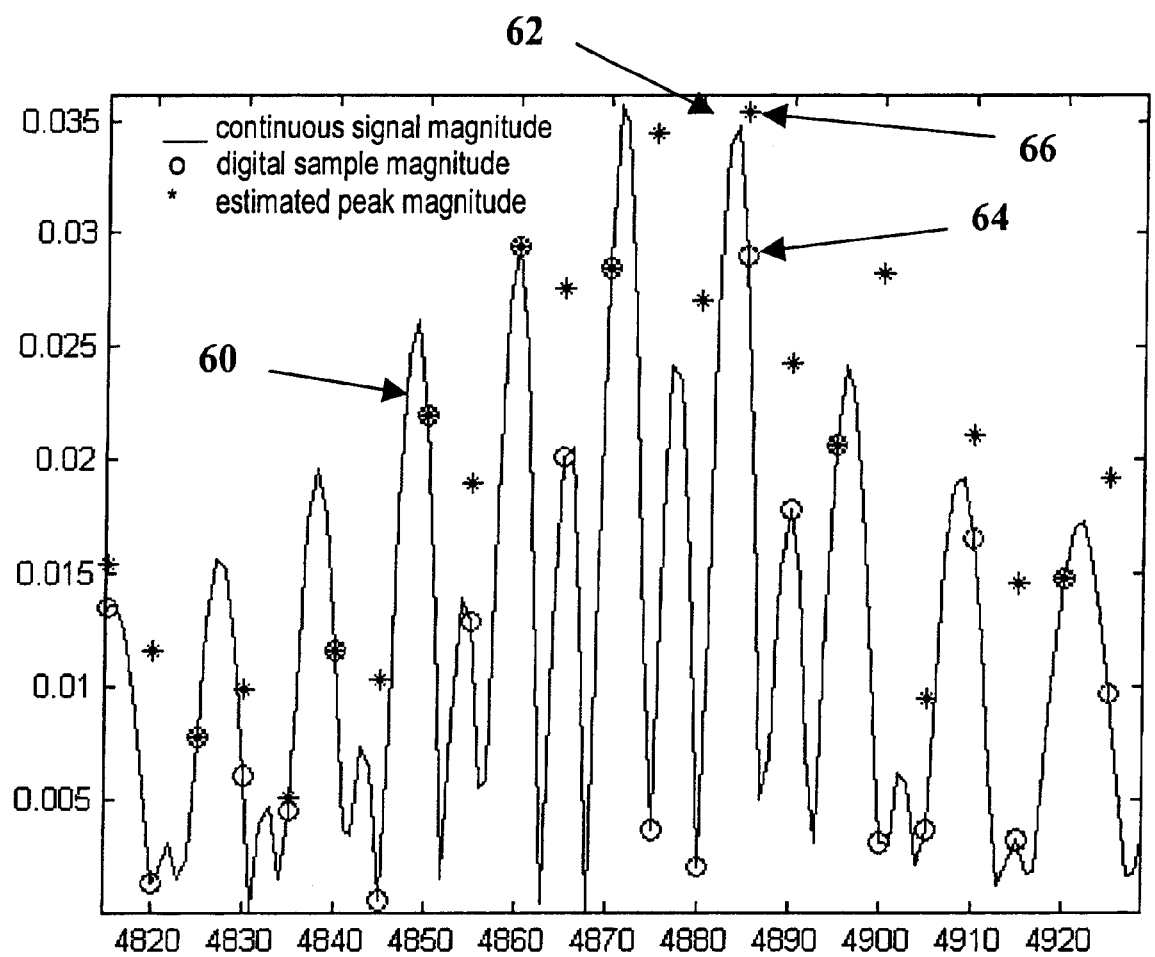
FIG. 6 shows the effect of continuous domain peak estimation according to the present invention.

FIG. 6 illustrates the use of digital domain peak-interpolators for estimating the peaks of the input signal, and shows the effect of continuous domain peak estimation according to the present invention. In FIG. 6 is a signal 60 representing the analog domain magnitude of a short section of the spoken consonant 's'. Signal 60 results from the conversion of a digital domain signal sampled at 8 Khz. When a continuous signal is put into the digital domain by sampling, the peaks of the continuous signal may not be sampled precisely at their maximum value. Often the highest peaks of the continuous signal happen to fall in between two samples. In such cases, simply utilizing the peak values of the digital sample will not relate to the actual peaks of the corresponding continuous signal. It can be seen that the digital samples, indicated by the small circles in FIG. 6, are often lower than the continuous analog signal peaks. For example, the value of an analog peak 62 is not accurately reflected in the value of a corresponding digital sample 64, as indicated by the small circle. In most telephony applications it is the dynamic range of the analog circuitry that is of concern, so it is important to estimate the actual peak values of the continuous signal for precise peak control. It is possible to reconstruct the corresponding continuous domain signal from the digital samples by way of interpolation. In the above example, an estimated peak value 66, as indicated by the asterisk, will result from interpolation. According to the present invention, any method of interpolation may be used for this purpose, such as the windowed Sinc interpolation filter. In a preferred embodiment of the present invention, several first-order IIR filters are used in parallel to estimate the continuous signal peaks. This configuration is illustrated in FIG. 7, and is especially efficient to implement.

Figure 7:
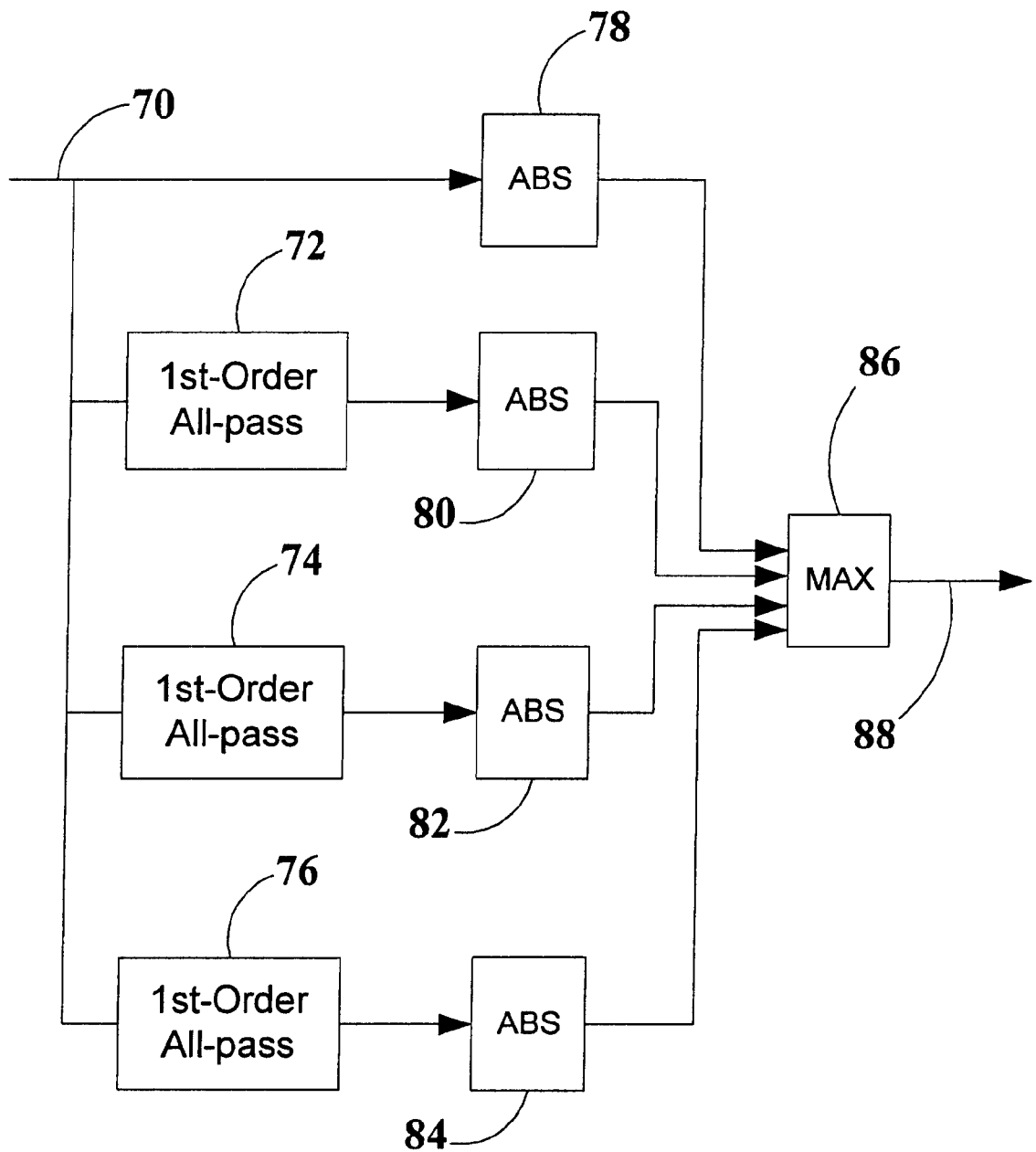
FIG. 7 shows a block diagram of a peak estimator using all-pass filters according to the present invention.

FIG. 7 shows a block diagram for a peak estimator using all-pass filters according to the present invention. An input 70 feeds an all-pass filter 72, an all-pass filter 74, and an all-pass filter 76. Absolute value detectors 78, 80, 82, and 84 are fed by input 70, all-pass filter 72, all-pass filter 74, and all-pass filter 76, respectively. The outputs of absolute value detectors 78, 80, 82, and 84 are input to a maximum value detector 86, from which an output 88 is derived. All-pass filters 72, 74, and 76 apply different phase shifts to input signal 70 to produce phase-shifted input signals. In each sample period, the sample with the highest absolute magnitude among input 70 and all-pass filters 72, 74, and 76 is thus delivered as the output.

The first-order IIR all-pass filters have the general transfer function:

$$H(z) = \frac{a + z^{-1}}{1 + az^{-1}} \quad (10)$$

For the example of FIG. 6, the coefficients a used in the all-pass filters 72, 74, and 76 have the respective values 0.6682, 0.4142, and 0.1989.

In FIG. 6, it can readily be seen that the peak estimates provided by the circuit of FIG. 7 (indicated by the asterisks in FIG. 6) matches much better the peaks of the continuous signal than the raw digital samples (indicated by the small circles).

Additional Embodiments of the Present Invention

It is noted that the processing principles of the present invention can be applied at any point within an audio transmission or distribution system from the audio source to right before the final audio reproduction, or anywhere in between. Specifically, in case of telecommunications or other voice communications systems, the processing can be applied at the transmitting end, before transmission, at the receiving end, before audio reproduction, or at any point of the telecommunication network between the transmitting and receiving end.

In systems with a local telephone switchboard, for example, the processing can be applied in the switchboard or within the telephones themselves for either receiving, transmitting, or both receiving and transmitting.

For a cordless telephone or mobile telephone that plugs into a base station (such as a cellular telephone, a "hands free" system used in cars, or a cordless home telephone), the processing can be applied within the handset or within the base station.

Figure 11:
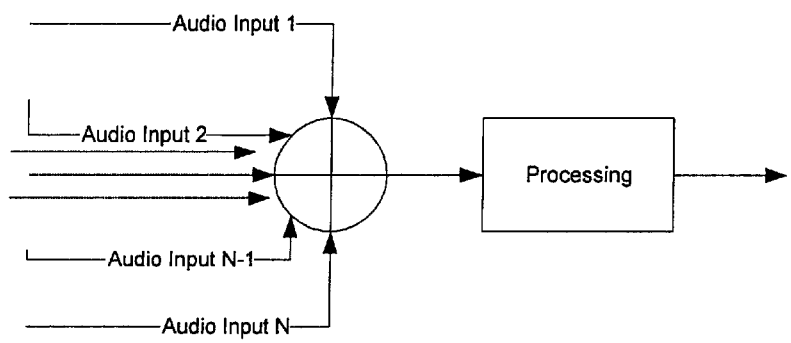
FIG. 11 shows an embodiment of the present invention where signal processing is applied to the sum of several individual signals in a video conferencing or teleconferencing application.

Other relevant embodiments include video conferencing, teleconferencing, and so forth, such as illustrated in FIG. 11, where multiple input signals are to be heard simultaneously. In such cases, processing according to the present invention can be performed for each signal individually, and at any point between the transmitting and receiving ends. Alternatively, the processing can be applied to the superposition of all input signals at a central location.

Similarly, in telephony applications, the present invention may be used with Voice over Internet Protocol and voice messaging (such as in various Unified Messaging systems). In such cases, processing can be performed at the transmitting end, the receiving end, or within the server.

Embodiments with Linked Processing of Multi-Channel Audio

Figure 8:
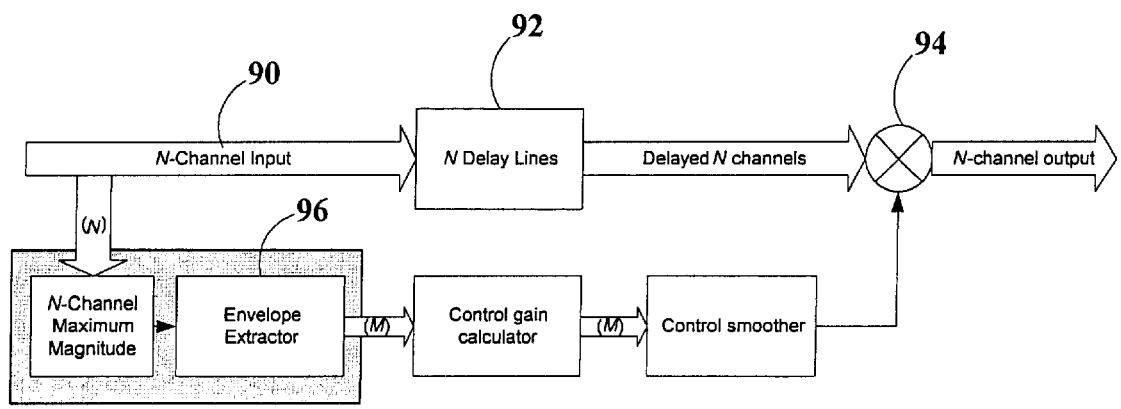
FIG. 8 shows an embodiment of the present invention where N audio channels are processed together.

It is noted that the present invention also applies where the input audio signal is supplied in a multi-channel format, such as in stereo or "surround sound" formats. In multi-channels audio formats the relative levels and phase between the channels encodes spatial information about sound source localization. In order to preserve this information, it is desirable to maintain the relative levels and phase between the channels. As shown in FIG. 8, for the case of N audio input channels 90, instead of single delay line (such as delay line 18 in FIG. 1), N delay lines 92 of the same length are used. Instead of single multiplier (such as multiplier 20 FIG. 1) N multipliers 94 are used, where each multiplier applies the same smoothed control signal to the respective delayed audio channel. Inside an envelope extractor 96, the instantaneous maximum magnitude between all audio channels is detected and supplied as the input to the same kind of envelope detector to create a unified envelope of the N channels. Subsequent processing is carried out in the same manner as in the single-channel case previously illustrated in FIG. 1.

Figure 9:
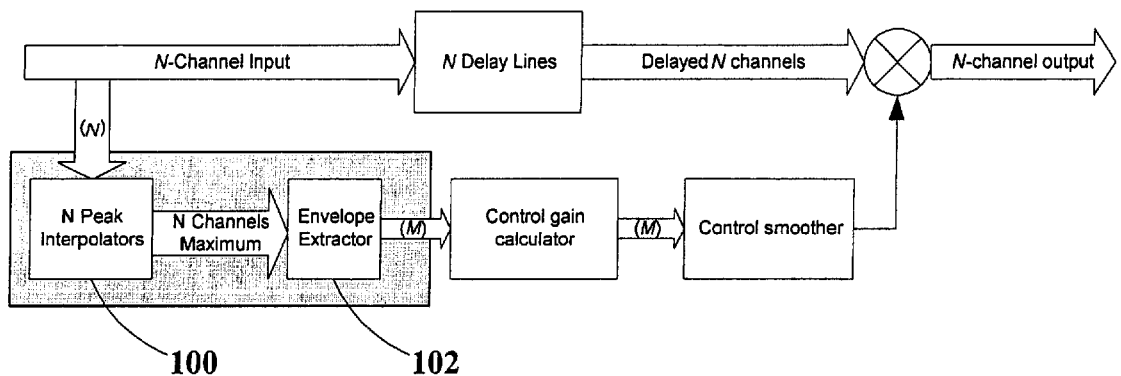
FIG. 9 shows an embodiment of the present invention where N audio channels are processed together, and where each channel has a dedicated peak interpolator.

As illustrated in FIG. 9 for the case of multi-channel audio where peak detection is needed, the peak detection has to be done individually for each channel by N peak interpolators 100. Here, the instantaneous maximum magnitude between all audio channels is detected, and supplied as the input to an envelope extractor 102 to create a unified envelope of the N channels. As before, subsequent processing is carried out as in the single-channel case previously illustrated in FIG. 1.

Figure 10:
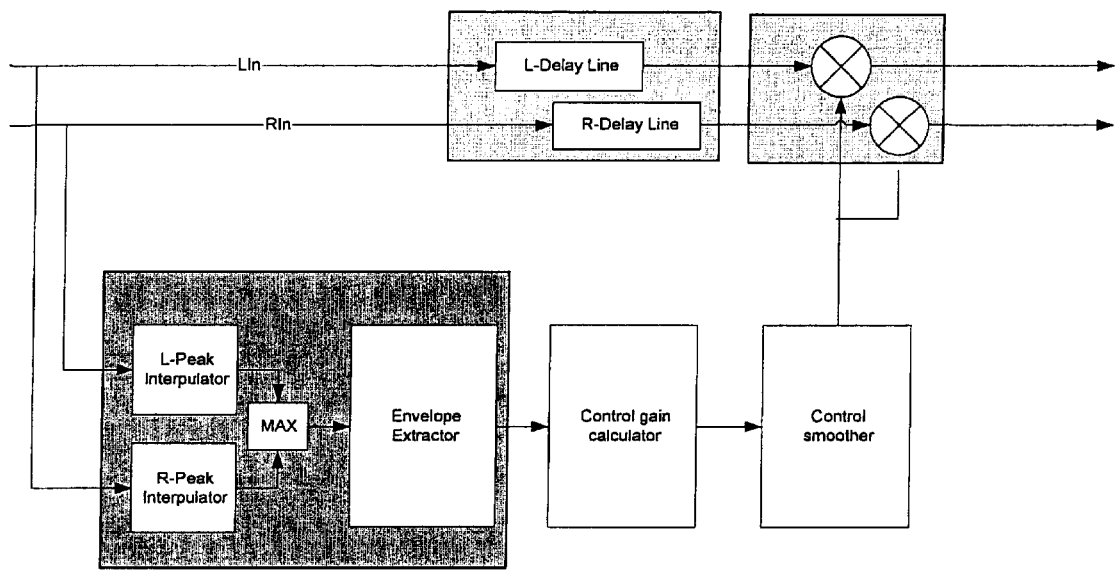
FIG. 10 shows an embodiment of the present invention where two audio channels are processed together, and where each channel has a dedicated peak interpolator.

The special case of stereo audio input with separate peak detection is shown in FIG. 10.

Figure 12:
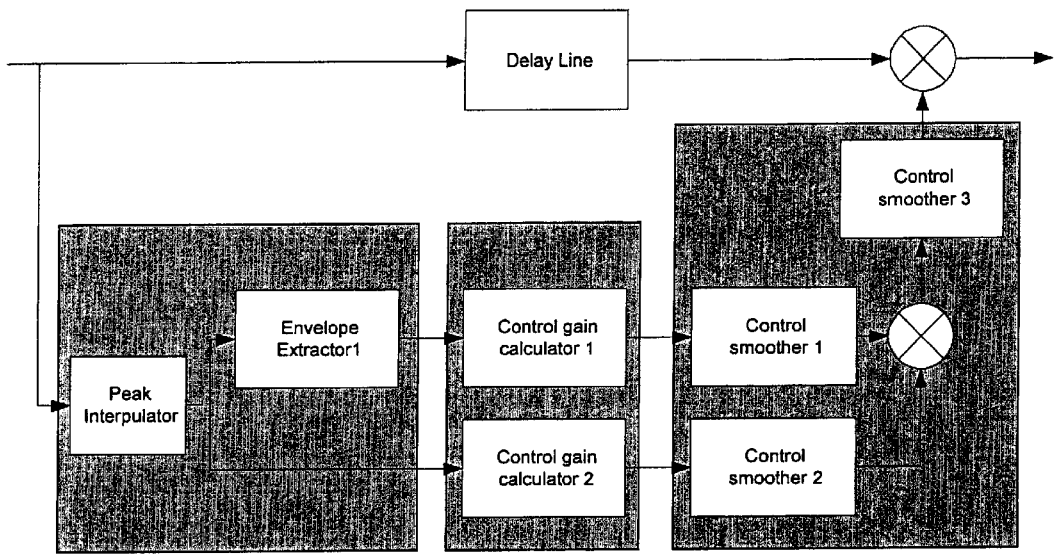
FIG. 12 Shows an embodiment of the present invention where the envelope detector is omitted from one of the control signal paths.
Figure 13:
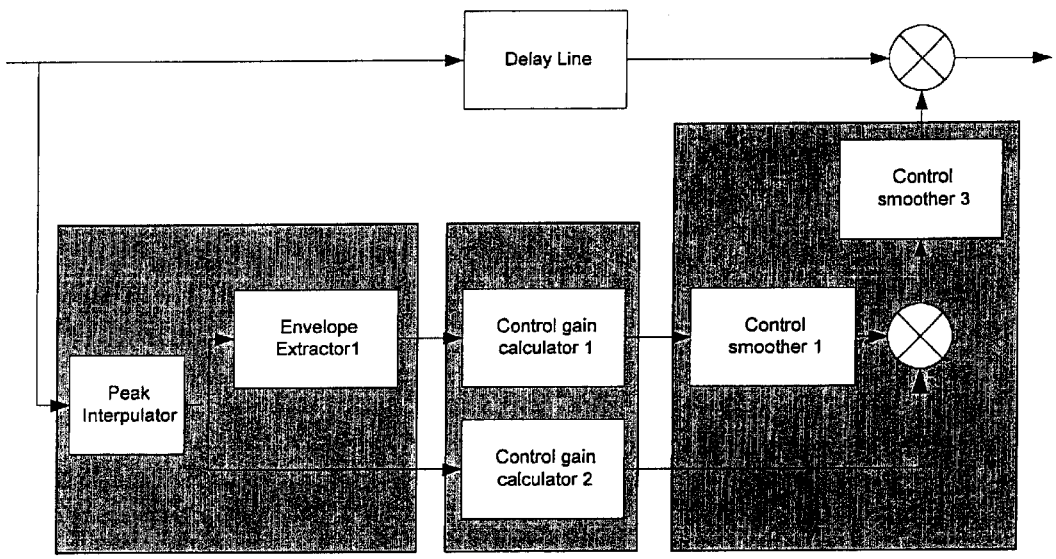
FIG. 13 shows an embodiment of the present invention where the envelope detector and the signal smoother are omitted from one of the control signal paths, and only smoothing by the final smoother is applied.

It is to be noted that in FIG. 2, not all the illustrated components are necessarily present. For certain applications, a subset of the components can be sufficient. Omitting some of the components may be imposed by processing power limitations or for considerations of efficiency. Omitting some of the components can lead to sub-optimal, but still satisfactory results. In a non-limiting example of the present invention, for control paths having a control gain calculator that operates only at low signal levels and applies principally to background noise (such as the gate control gain calculator), artifacts pertaining to audio quality are less critical. Thus, in some applications envelope detection may be omitted from such control signal paths. Also, in such cases a common final smoother may be sufficient and the control smoother dedicated to this control path may be omitted. Examples of such configurations are shown in FIG. 12 and FIG. 13.

While the invention has been described with respect to a limited number of embodiments, it will be appreciated that many variations, modifications and other applications of the invention may be made.

What is claimed is:

1. A voice signal processing system receiving an input signal characterized by at least one envelope, the system having an output signal and a specified maximum gain, the system comprising:

(a) an input for receiving the input signal;
(b) an envelope extractor coupled to said input for extracting at least one envelope of the input signal;
(c) a control gain calculator coupled to said envelope extractor, for calculating at least one gain, wherein said control gain calculator is operative to performing a calculation taken from the group containing:
i) a first gain calculation of $$\frac{1}{\frac{1}{Gain} + \left(1 - \frac{1}{Gain}\right) * Env},$$

wherein Env is said envelope and Gain is the specified maximum gain;
ii) a second gain calculation of the minimum of 1.0 and Env/Th, wherein Th is a threshold below which the result of said second gain calculation decreases; and
iii) the product of said first gain calculation and said second gain calculation;
(d) a control smoother coupled to said control gain calculator for smoothing said at least one gain, and for delivering as the output signal a control gain;
(e) a delay line coupled to said input, to produce a delayed input; and
(f) an output multiplier coupled to said delay line and to said control smoother for applying said control gain to said delayed input.

2. The system according to claim 1, wherein:
(a) the input signal is in the time domain and has peaks; and
(b) said envelope extractor includes a peak interpolator in the digital domain for estimating said peaks of the input signal.

3. The system according to claim 2, wherein said peak interpolator includes:
i) at least one all-pass filter coupled to said input for delivering at least one phase-shifted input signal having a magnitude; and
ii) a selector for selecting said phase-shifted input signal having the greatest magnitude.

4. The system according to claim 1, wherein:
(a) said control smoother includes at least one linear phase FIR filter of order N, for smoothing said at least one gain;
(b) said delay line has a delay measured in sample periods;
(c) said order N equals the length of said delay in said sample periods; and
(d) said linear phase FIR filter is operative to performing a calculation of $$y(i) = a_1 * x(i-N+1) + a_2 * x(i-N+2) + \ldots + a_k * x(i-N+k) + \ldots + a_N * x(i)$$

where:
i) said $y(i)$ is the output of said linear phase FIR filter at a time i;
ii) said $x(i)$ is the input to said linear phase FIR filter at said time i;
iii) said $a_1, a_2, \ldots a_k,$ and $a_N$ are coefficients of said linear phase FIR filter; and iv) $a_1+a2+ \ldots +a_k+ \ldots +a_N=1$.

5. A method for processing a voice signal characterized by at least one envelope, the method resulting in an output signal characterized by a specified maximum gain, the method comprising the steps of:

(a) receiving the voice signal;

(b) extracting at least one envelope of the voice signal;

(c) performing a calculation taken from the group containing:

i) a first gain calculation of $$\frac{1}{\frac{1}{Gain}+\left(1-\frac{1}{Gain}\right)*Env},$$

wherein Env is said envelope and Gain is the specified maximum gain;

ii) a second gain calculation of the minimum of 1.0 and Env/Th, wherein Th is a threshold below which the result of said second gain calculation decreases; and iii) the product of said first gain calculation and said second gain calculation;

(d) smoothing said at least one gain, and delivering as the output signal a control gain;

(e) delaying the voice signal to produce a delayed input; and (f) multiplying said delayed input by said control gain.

6. The method according to claim 5, wherein the input signal is in the time domain and has peaks, the method further comprising the step of:

(g) estimating said peaks of the input signal by digital domain peak interpolation.

7. The method according to claim 6, further comprising the steps of:

(h) shifting the phase of the input signal to produce at least one phase-shifted input signal having a magnitude; and (i) selecting said phase-shifted input signal having the greatest magnitude.

8. The method according to claim 5, wherein said delayed input has a delay measured in sample periods, and wherein smoothing said at least one gain includes the step of filtering said at least one gain by performing the calculation $$y(i)=a_1*x(i-N+1)+a_2*x(i-N+2)+ \ldots +na_k*x(i-N+k)+ \ldots +a_N*x(i)$$

where:

(a) N is the length of said delay in said sample periods;

(b) said y(i) is the output of said filtering at a time i;

(c) said x(i) is the input to said filtering at said time i;

(d) said $a_1, a_2, \ldots a_k$, and $a_N$ are coefficients; and (e) $a_1+a_2+ \ldots +a_k+ \ldots +a_N=1$.

* * * * *

UNITED STATES PATENT AND TRADEMARK OFFICE
CERTIFICATE OF CORRECTION

PATENT NO. : 6,535,846 B1
DATED : March 18, 2003
INVENTOR(S) : Meir Shashoua

It is certified that error appears in the above-identified patent and that said Letters Patent is hereby corrected as shown below:

<u>Column 11,</u>
Line 1, delete "$a_1+a2+$" and insert therefor -- $a_1+a_2+$ --.

<u>Column 12,</u>
Lline 17, delete "... $+na_k*$" and insert therefor -- ... $+a_k*$ --

Signed and Sealed this

Second Day of December, 2003

JAMES E. ROGAN
*Director of the United States Patent and Trademark Office*